United States Patent [19]

Oura

[11] 4,408,094

[45] Oct. 4, 1983

[54] OUTPUT CIRCUIT

[75] Inventor: Toshio Oura, Tokyo, Japan

[73] Assignee: Nippon Electric Co., Ltd., Tokyo, Japan

[21] Appl. No.: 197,431

[22] Filed: Oct. 16, 1980

[30] Foreign Application Priority Data

Oct. 16, 1979 [JP] Japan ............................ 54-133118

[51] Int. Cl.³ ........................................ H03K 13/02

[52] U.S. Cl. ......................... 381/120; 340/347 DA; 340/347 M

[58] Field of Search ........... 179/1 A, 1 SA; 330/264; 364/709, 710; 340/347 DA, 347 M; 307/205, 239, 254

[56] References Cited

U.S. PATENT DOCUMENTS 4,209,781 6/1980 Puri et al. ........................ 179/1 A

OTHER PUBLICATIONS

National Semiconductor Corp, "MOS Integrated Circuits", 1972, p. 167.

*Primary Examiner*—Emanuel S. Kemeny
*Attorney, Agent, or Firm*—Sughrue, Mion, Zinn, Macpeak & Seas

[57] ABSTRACT

An improved output circuit for driving a loudspeaker with a single-polarity current source is disclosed. The output circuit comprises a digital to analog converter including a series circuit of a variable register and a field effect transistor for generating a variable bias potential, a plurality of current source transistors and a plurality of transfer field transistors each for selectively applying the variable bias potential to a gate of an associated current source transistor in accordance with a digital signal; a loudspeaker; and two pairs of switching transistors for alternately supplying the loudspeaker with different polarities of an output current of the digital to analog converter.

9 Claims, 7 Drawing Figures

OUTPUT CIRCUIT

BACKGROUND OF THE INVENTION

The present invention relates to an output circuit, and more particularly to an output circuit for driving a loudspeaker with an output of a monopolar (i.e. single directional) current output type digital-analog (D/A) converter.

In recent years, with the progress of the digital information processing technique, various electronic instruments adapted to deliver output information directly by means of speech without employing a display or the like such as, for example, a speech or sound output type desk computer, a language exercising machine, etc. have been developed.

In these speech or sound output type electronic instruments it has been a common practice that every information is basically digitally calculated and processed and the resultant digital information is further converted into analog information so that a loudspeaker serving as an output device is driven by the analog information. In the heretofore known speech output type electronic instrument, the digital-analog (D/A) converter is applied with a reference potential (e.g. ground potential) and either a positive or negative power supply potential as an operating power supply, and hence the output of the D/A converter can take only a monopolar value. Accordingly, it is impossible to drive a loudspeaker by making direct use of such a D/A converted output. Therefore, in the prior art electronic instrument, provision is made such that a loudspeaker may be driven by the D/A converted output via an output transformer or an A.C. amplifier (audio amplifier). Consequently, it was difficult to manufacture a speech output type electronic instrument at low cost. In addition, as a matter of course, the use of an output transformer or an A.C. amplifier prevents reduction in size of the instruments. It is also to be noted that, although it is possible to drive a loudspeaker by applying a monopolar D/A converter output directly thereto without employing an output transformer or the like, it is necessary to continuously feed a bias current approximately equal to a medium current value of the D/A converter output current to the loudspeaker so that the loudspeaker may be fed a current swinging in the both the power supply voltage and the reference voltage directions in correspondence to the output current swing relative to the medium current value of the D/A converter current. Consequently, despite a large power consumption the effective output is reduced to only $\frac{1}{4}$ of the output power.

SUMMRY OF THE INVENTION

It is therefore one object of the present invention to provide a low cost output circuit which can drive a loudspeaker with a monopolar analog signal.

Anogher object of the present invention is to provide an output circuit for a speech output type information processor, which can be easily realized as a semiconductor integrated circuit.

The output circuit according to the present invention comprises a digital to analog converter including a series circuit of a variable register and a field effect transistor for generating a variable bias potential, a plurality of current source field effect transistors and a plurality of transfer transistors each for selectively supplying a gate of an associated current source field effect transistor with the variable bias potential in response to an associated digital signal, a speaker, and two pairs of switch transistors for alternately supplying the speaker with an output current of a single-polarity of the digital to analog converter. According to the present invention, the amount of the analog output current of the digital to analog converter can be linearly controlled by the variable register. Namely, the amounts of the output currents of the respective current source transistors are controlled in proportion to the value of the variable bias potential, and hence the total currents of the current source field effect transistors can be made proportional to the variable bias potential. This function can be used as a "volume controller for the speaker". The variable register employed in the present invention may be a known variable register of a mechanical type such as a potentiometer, or it may be a digital to analog converter whose current output is adapted to flow through the field effect transistor of the series circuit.

BRIEF DESCRIPTION OF THE DRAWINGS

The above-mentioned and other features and objects of the present invention will become more apparent by reference to the following detailed escription of preferred embodiments of the invention taken in conjunction with the accompanying drawings, wherein.

DESCRIPTION OF THE PRIOR ART

At first description will be made on a speech output circuit for driving a loudspeaker with a D/A converter output in the prior art with reference to FIG. 1.

Figure 1:
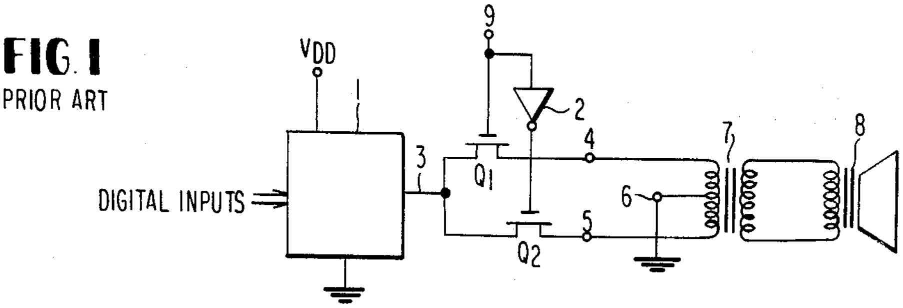
FIG. 1 PRIOR ART
FIG. 1 is a schematic circuit diagram showing a circuit for driving a loudspeaker with a D/A converter in the prior art.

Referring now to FIG. 1, one current output terminal 3 of a monopolar current type D/A converter 1, in which the output current flows in only one direction, is connected to sources of first and second insulated gate field effect transistors (hereinafter called IGFET's) $Q_1$ and $Q_2$. The drain of the transistor $Q_1$ is connected to an output terminal 4. The drain of the transistor $Q_2$ is connected to another output terminal 5. Signals of opposite phases to each other are applied to the gates of the transistors $Q_1$ and $Q_2$, respectively. The output terminals 4 and 5 are connected to opposite ends of a primary i.e. input side of an output transformer 7 while a center point 6 of the primary side is connected to the other end of the reference voltage supply e.g. ground potential, and an electro-acoustic transducer such as, for example, a loudspeaker 8 is connected across the secondary side of the output transformer 7 to be driven by the secondary output.

In this prior art circuit arrangement, when an input signal applied to a current polarity control terminal 9 which is connected directly to the gate of the transistor $Q_1$ and via an inverter 2 to the gate of the transistor $Q_2$, is at "1" level, the transistor $Q_1$ is turned ON but the transistor $Q_2$ is turned OFF because the output of the inverter 2 is at a "0"-level. Therefore, a current flows from the center point 6 of the primary side through the upper half of the primary side winding, the output terminal 4, the transistor $Q_1$ and the current output terminal 3 of the D/A converter. As a result, a current is fed from the secondary side of the output transformer 7 to the loudspeaker 8. When the input signal applied to the current polarity control terminal 9 is changed to "0" level, the transistor $Q_1$ is turned OFF and the transistor $Q_2$ is turned ON, so that a current flows from the center point 6 of the primary side through the lower half of the primary side winding, the output terminal 5, the transistor $Q_2$, and the current output terminal 3 of the D/A converter. Then a current is fed in the opposite direction to the previous control phase from the secondary side of the output transformer 7 to the loudspeaker, and owing to the repeated alternation of the direction of current flowing through the loudspeaker 8, vibration is induced in the loudspeaker 8 resulting in generation of speech.

This circuit arrangement essentially necessitates the output transformer 7, and hence it has a disadvantage that a manufacturing cost is high. Otherwise, in the case of employing a voltage type D/A converter was used in the prior art, it was necessary to drive a loudspeaker always by the intermediary of an amplifier, and hence there was a disadvantage that the amplifier involved a large number of parts was required and thus the manufacturing cost was raised.

DETAILED DESCRIPTION OF THE PREFERRED EMBODIMENT

Now, a basic circuit structure employed in of the present invention will be described with reference to FIG. 2.

A D/A converter 100 is a monopolar current output type D/A converter having one current output terminal 10 and operated with a power supply voltage $V_{DD}$ and a reference voltage e.g. ground potential. In the remainder of the speech output circuit according to the present invention are included insulated gate field effect transistors (IGFET's) of the same conductivity (N-channel) type $Q_3$, $Q_4$, $Q_5$ and $Q_6$, having resistances sufficiently small as compared to the internal resistance of the D/A converter 100. The D/A converter 100 is not specifically limited to any particular type and, for instance, a D/A converter as fully disclosed in U.S. Pat. No. 4,055,773 could be conveniently used in the speech output circuit according to the present invention.

At first, when the current polarity control terminal 11 is at "0" level, the transistors $Q_3$ and $Q_6$ are turned OFF. While the output of the inverter 12 is at a "1"-level, the transistors $Q_4$ and $Q_5$ are turned ON. Therefore, a current defined by the monopolar current output type D/A converter 100 flows through the terminal 16, the transistor $Q_5$, the terminal 13, the loudspeaker 15, the terminal 14, the transistor $Q_4$, the current output terminal 10 and the D/A converter 100 and thereby the speaker 15 is driven in one direction.

Subsequently, when the current polarity control terminal 11 changes in potential to a "1" level, the transistor $Q_3$ and $Q_6$ are turned ON, while the transistors $Q_4$ and $Q_5$ are turned OFF, so that a current defined by the monopolar current output type D/A converter 100 flows through the terminal 16, the transistor $Q_6$, the terminal 14, the loudspeaker 15, the terminal 13, the transistor $Q_3$, the current output terminal 10 and the D/A converter 100 and thereby the loudspeaker 15 is driven in the opposite direction by the current flowing through the loudspeaker 15 in the reversed direction with respect to the preceding period. Here, it is to be noted that to the current polarity control terminal is applied a digital signal element defining the polarity of the speech output current, whereas digital signal elements defining the amplitude of the speech output current are applied to the D/A converter 100 and, hence, the amplitude of the speech output current is determined by the analog output from the D/A converter 100.

Figure 2:
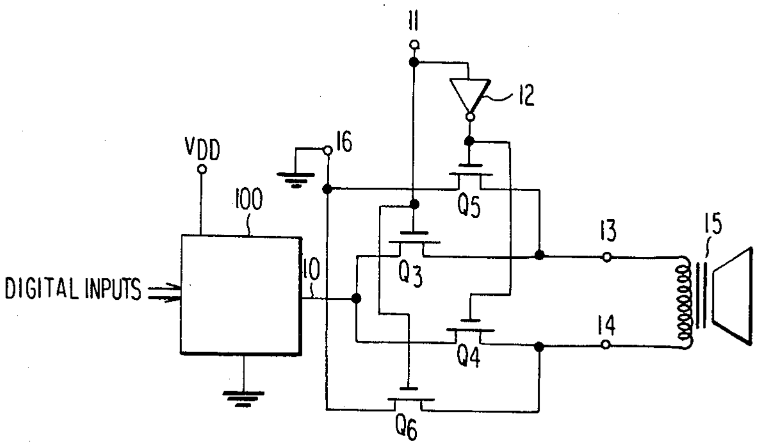
FIG. 2 PRIOR ART
FIG. 2 is a schematic circuit diagram showing a basic structure employed in the present invention.
Figure 3:
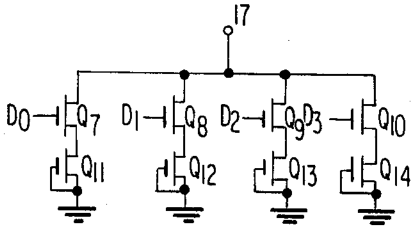
FIG. 3 PRIOR ART
FIG. 3 is a schematic circuit diagram showing one example of a D/A converter to be used in the circuit illustrates in FIG. 2.

In FIG. 3 is shown one example of the monopolar current output type D/A converter 100 in FIG. 2, and in this example it is illustrated as a D/A converter having a simple 4-bit construction. In this circuit arrangement, transistors $Q_7$, $Q_8$, $Q_9$ and $Q_{10}$ are N-channel enhancement type IGFET's, whereas transistors $Q_{11}$, $Q_{12}$, $Q_{13}$ and $Q_{14}$ are N-channel depletion type IGFET's and used as constant current sources. The IGFET's $Q_7$, $Q_8$, $Q_9$ and $Q_{10}$ are switching IGFET's which serve to merely swithc ON or OFF the currents flowing through the IGFET's $Q_{11}$, $Q_{12}$, $Q_{13}$ and $Q_{14}$, respectively, in response to the digital signal inputs $D_1$, $D_2$, $D_3$ and $D_4$, respectively. The IGFET's $Q_{12}$, $Q_{13}$ and $Q_{14}$ have their mutual conductances, that is, their ratios (W/L) of effective channel width (W) to effective channel length (L), selected to be 2 times, 4 times and 8 times, respectively, as high as the W/L ratio of the IGFET $Q_{11}$ and, therefore, a current produced by the D/A conversion in response to the 4-bit digital input signal elements applied to the respective gate inputs $D_1$, $D_2$, $D_3$ and $D_4$ flows out from the current output terminal 17 of the D/A converter through a given load to an ungrounded end $V_{DD}$ of a power supply whose the other end is grounded.

Figure 4:
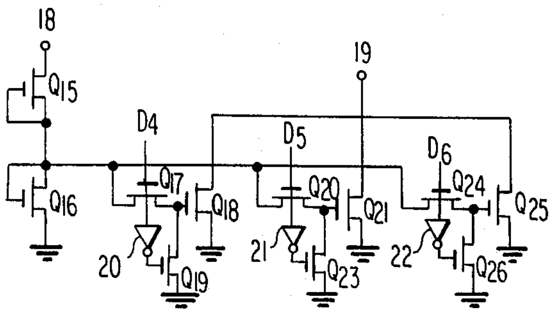
FIG. 4 PRIOR ART
FIG. 4 is a schematic circuit diagram showing another example of a D/A converter to be used in the circuit illustrated in FIG. 2.

Another example of a monopolar current output type 3-bit D/A converter is illustrated in FIG. 4, in which transistors $Q_{16}$, $Q_{17}$, $Q_{18}$, $Q_{19}$, $Q_{20}$, $Q_{21}$, $Q_{23}$, $Q_{24}$, $Q_{25}$ and $Q_{26}$ are N-channel enhancement type IGFET's, and transistor $Q_{15}$ is a depletion type IGFET. Reference numerals 20, 21 and 22 designate inverters and numeral 18 designates a terminal is to be connected to a power supply. Reference numeral 19 designates an output terminal of the monopolar current output type D/A converter. Digital signal inputs $D_4$, $D_5$ and $D_6$ for amplitude control are weighted in the ratio of 1:2:4 respectively. On the other hand, the IGFET's $Q_{16}$, $Q_{18}$, $Q_{21}$ and $Q_{25}$ are so designed that their W/L ratios are one, two and four times the W/L ratio of the IGFET $Q_{16}$. Therefore, if it is assumed that digital signal inputs $D_4$, $D_5$ and $D_6$ of "1", "0" and "1", for instance, are applied, then the IGFET's $Q_{17}$, $Q_{23}$ and $Q_{24}$ are turned ON, while the IGFET's $Q_{19}$, $Q_{20}$ and $Q_{26}$ are turned OFF. Hence through the current output terminal 19 wire flow a controlled current equal in magnitude to the sum of the currents flowing through the IGFET's $Q_{18}$ and $Q_{25}$, that is, a controlled current that is 5 times as large as the current flowing through the IGFET $Q_{16}$ in correspondence to the digital input signal "1 0 1".

As described above, according to the present invention, an output circuit for a monopolar current output type D/A converter can be simply constructed within a simple chip without necessitating any parts to be mounted externally at all, and hence the invention has a great advantage that it can provide a loudspeaker drive circuit of low cost.

Figure 6:
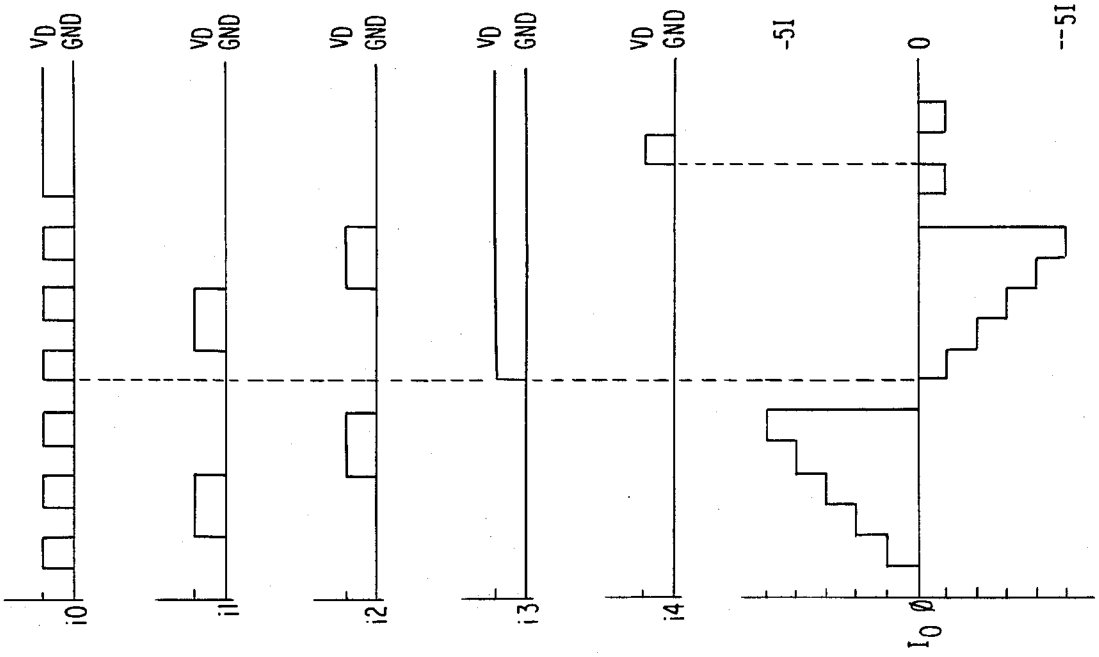
FIG. 6 is a timing chart to be used for explaining the operation of the circuit shown in FIG. 5.
Figure 5:
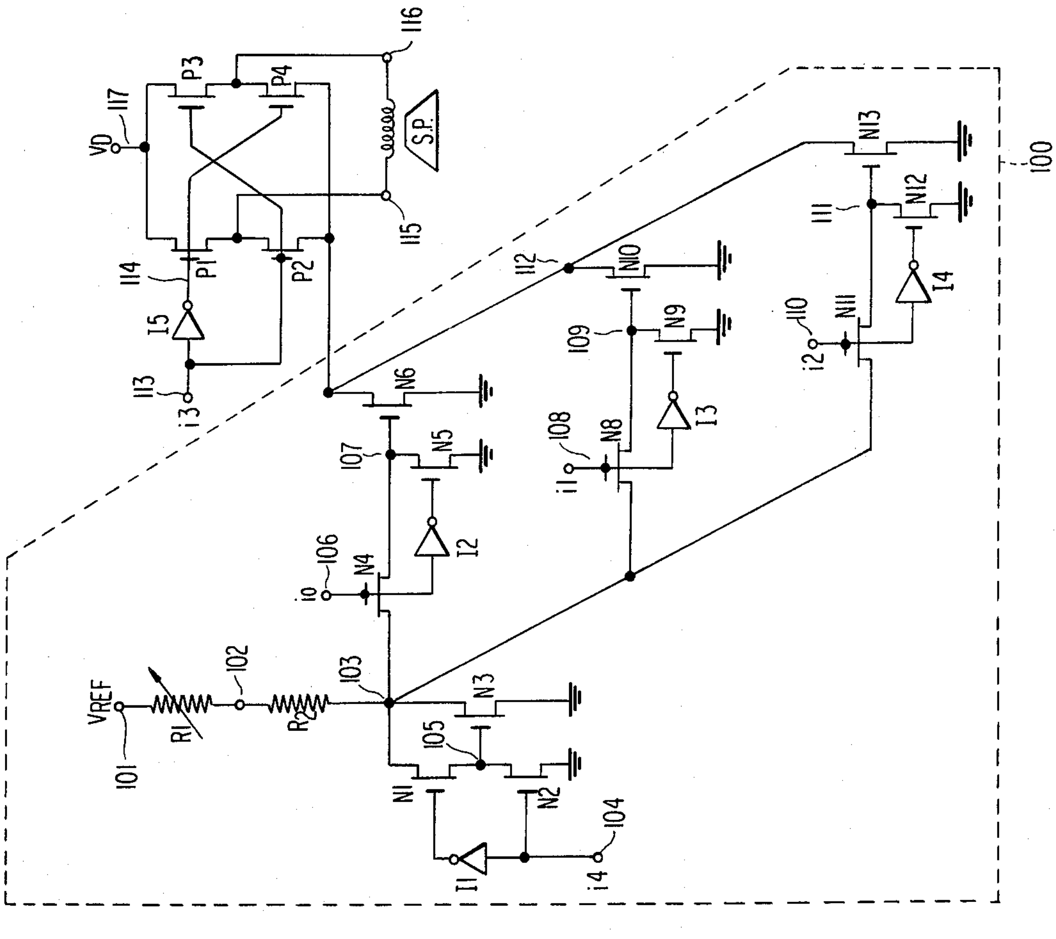
FIG. 5 is a detailed circuit diagram of one embodiment of the present invention.

An embodiment of the present invention is illustrated in FIG. 5, and the operation and effect of this circuit arrangement will be described with reference to a timing chart shown in FIG. 6. In this embodiment, P-channel IGFET's $P_1$—$P_4$ are employed as switches in place of N-channel IGFET's $Q_3$—$Q_6$ in FIG. 2, and a power voltage $V_D$ is used as a reference voltage. In this circuit arrangement, a variable resistor $R_1$ is connected between a first reference voltage ($V_{REF}$) terminal 101 and a terminal 102, and a resistor $R_2$ is connected between the terminal 102 and a node 103. To a power-off signal ($i_4$) terminal 104 are connected a gate of an N-channel IGFET $N_2$ and an input of an inverter $I_1$. A drain of an N-channel IGFET $N_1$ is connected to the node 103 and its gate and source are connected to the output of the inverter $I_1$ and a node 105, respectively. The drain of the IGFET $N_2$ is connected to the node 105 and its source is grounded. A drain of an N-channel IGFET $N_3$ is connected to the node 103 and its gate and source are connected to the node 105 and ground potential, respectively. A drain of an N-channel IGFET $N_4$ is connected to the node 3 and its gate and source are connected to an $i_0$ input terminal 106 and a node 107, respectively. A drain of an N-channel IGFET $N_5$ is connected to the node 107 and its gate and source are connected to an output of an inverter $I_2$ and ground potential, respectively. The input of the inverter $I_2$ is connected to the $i_0$ input terminal 6. A drain of an N-channel IGFET $N_6$ is connected to a node 112 and its gate and source are connected to the node 107 and ground potential, respectively.

A drain of an N-channel IGFET $N_8$ is connected to the node 103 and its gate and source are connected to an $i_1$ input terminal 108 and a node 109, respectively. A drain of an N-channel IGFET $N_9$ is connected to the node 109 and its gate and source are connected to an output of an inverter $I_3$ and ground potential, respectively. The input of the inverter $I_3$ is connected to the $i_1$ input terminal 108. A drain of an N-channel MOSFET $N_{10}$ is connected to the node 112 and its gate and source are connected to the node 109 and ground potential, respectively.

A drain of an N-channel IGFET $N_{11}$ is connected to the node 103 and its gate and source are connected to an $i_2$ input terminal 110 and to a node 111, respectively. An N-channel IGFET $N_{12}$ has a drain connected to the node 111, a gate connected to an output of an inverter $I_4$ and a source which is grounded. The input of the inverter $I_4$ is connected to the $i_2$ input terminal 110. An N-channel IGFET $N_{13}$ has a drain connected to the node 112, a gate connected to the node 111 and a source which is grounded.

A P-channel IGFET P, has a source connected to a power supply ($V_D$) terminal 117, a gate connected to node 114 and a drain connected to an output terminal 115. A P-channel IGFET $P_2$ has a source connected to the output terminal 115. A gate connected to an $i_3$ input terminal 113 and a drain connected to the node 112. A P-channel IGFET $P_3$ has a source connected to the power supply ($V_D$) terminal 117, a gate connected to the $i_3$ input terminal 113 and a drain connected to an output terminal 116. A P-channel IGFET $P_4$ has a source connected to the output terminal 116, a gate connected to the node 114 and a drain connected to the node 112. An input of an inverter $I_5$ is connected to the $i_3$ input terminal 113 and its output is connected to the node 114. Between the output terminals 115 and 116 is connected a loudspeaker.

Now the operation of the loudspeaker drive D/A converter shown in FIG. 5 will be explained with reference to FIG. 6, in which timing relations between the voltage waveforms applied to the $i_0$ to $i_4$ input terminals 106, 108, 110, 113 and 114 and the current $I_0$ flowing through a loudspeaker connected between the output terminals 115 and 116 are shown.

In operation, when the $i_4$ input terminal 104 is at a low level, the IGFET $N_1$ is conducting, while the IGFET $N_2$ is non-conducting. Accordingly, the nodes 103 and 105 take the same potential, and the source-drain voltage of the IGFET N3 takes such value that the current flowing through the resistors $R_1$ and $R_2$ may balance with the drain current of the IGFET $N_3$. At this moment, if the $i_3$ input terminal 113 is at a low level, the IGFET's $P_1$ and $P_4$ are non-conducting, while the IGFET's $P_2$ and $P_3$ are conducting. Furthermore, if the $i_0$, $i_1$ and $i_2$ input terminals 106, 108 and 110 are at a low level, the IGFET's $N_4$, $N_8$ and $N_{12}$ are conducting while the IGFET's $N_5$, $N_9$ and $N_{12}$ are non-conducting, so that the nodes 107, 109 and 111 are held at a low level and the IGFET's $N_6$, $N_{10}$ and $N_{13}$ are non-conducting. Therefore, the current $I_0$ flowing through the loudspeaker is kept zero.

Subsequently, when the $i_0$ input terminal 106 is turned to a high level, the IGFET $N_4$ becomes conducting while the IGFET $N_5$ becomes non-conducting, so that the node 107 takes the same potential as the node 103, and hence the IGFET $N_6$ becomes conducting. If the IGFET's $N_3$ and $N_6$ have the same mutual conductance gm and threshold voltage $V_T$, then a current having the same magnitude as the drain current of the IGFET $N_3$ flows from the power supply $V_D$ terminal 117 through the IGFET $P_3$, the loudspeaker, the MOSFET $P_2$ and the MOSFET $N_6$. If the ratios between the gm of the IGFET's $N_6$, $N_{10}$ and $N_{13}$ are selected to be 1:2:4, then the current $I_0$ flowing through the loudspeaker will change in proportion to the analog version of the digital input signal elements applied to the $i_0$, $i_1$ and $i_2$ input terminals which correspond to the binary code elements of 1, 2 and 4, respectively. When a current polarity control signal applied to the $i_3$ input terminal is turned to a high level, the IGFET's $P_1$ and $P_4$ become conducting, while the IGFET's $P_2$ and $P_3$ become non-conducting, so that a current $I_0$ flows through the loudspeaker in the opposite direction to that in the case where the current polarity control signal applied to the $i_3$ input terminal is at a low level, with a magnitude determined by the digital input signal elements applied to the $i_0$, $i_1$ and $i_2$ input terminals 6, 8 and 10, respectively.

Under the above-mentioned condition, if the resistance value of the variable resistor $R_1$ is varied, the drain current of the IGFET $N_3$ changes, and thus the potential at the node 3 also changes. Then, since the currents flowing through the IGFET's $N_6$, $N_{10}$ and $N_{13}$, respectively, are proportional to the current flowing through the IGFET $N_3$, the current $I_0$ flowing through the loudspeaker can be varied in accordance with the variation of the resistance value of the variable resistor $R_1$ without lowering the resolution of the D/A converter circuit, and thereby volume control for the loudspeaker can be achieved.

In this embodiment, the signal $i_4$ is simply used for electrically connecting the gate of the transistor $N_3$ to the node 103 throughout normal drive operation by keeping it at a low level. If the signal $i_4$ is made a high level, the transistor $N_3$ becomes non-conducting and hence a potential at the node 103 takes the highest value to make the current output at the node 112 a full value irrespective of the digital inputs $i_0$ to $i_2$. The signal $i_4$ is not essential to the present invention, and hence the circuit including the transistors $N_1$ and $N_2$ may be replaced with a single wiring for connecting the gate of the transistor $N_3$ to the node 103.

As a matter of course, the frequency of the signal $i_3$ is an audio frequency of 20 to 20000 hertz and hence it is easy to accurately produce its complementary signal having opposite phase to the signal $i_3$ by an inverter $I_5$. Accordingly, any problem such as phase cancellation and/or doubling frequency distortion does not occur.

Figure 7:
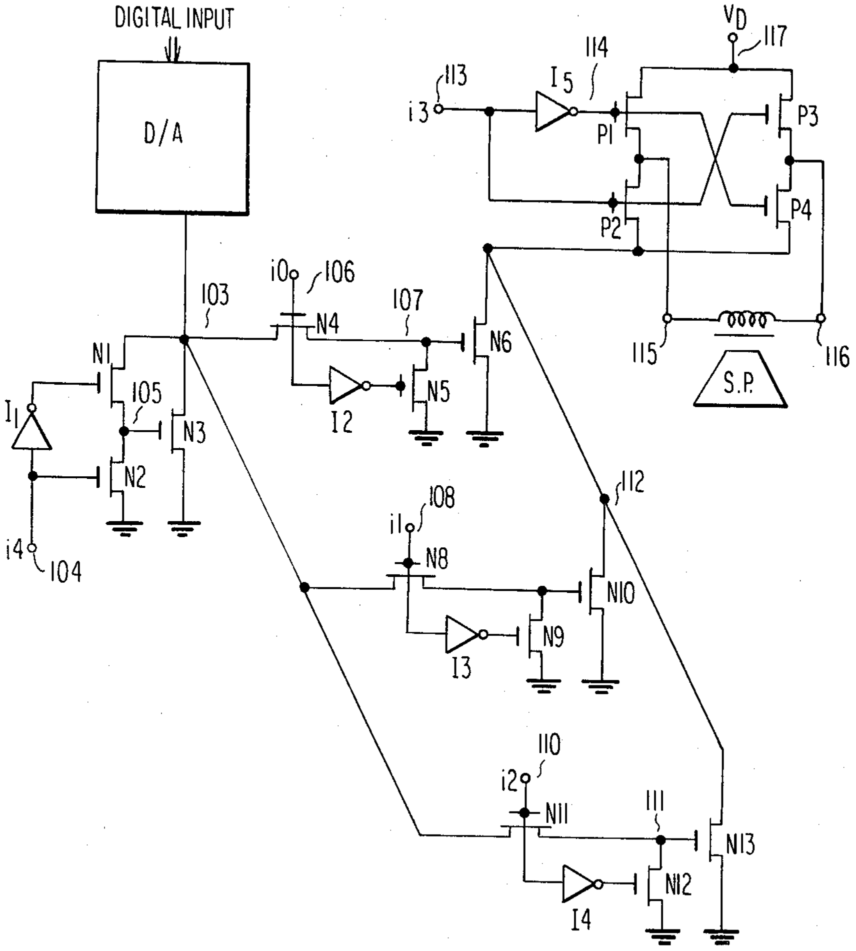
FIG. 7 is a detailed circuit diagram showing a modification of the loudspeaker drive circuit shown in FIG. 5.

In FIG. 7 is illustrated a modification of the circuit arrangement shown in FIG. 5. In this modification, the reference current of the D/A converter is varied in response to a digital control signal to change the output current amplitude without lowering the resolution of the D/A converter, and thereby volume control for the loudspeaker can be achieved by means of a digital control signal.

In this modification, if the variation of the reference current obtained as an output current of an additional current output type D/A converter for volume control has a linear relation to the digital control input for the additional A/D converter, then the amplitude of the speech current flowing through the loudspeaker is also linearly related to the digital control input. On the other hand, since a volume of sound is measured in a logarithmic scale, that is, in decibels, if the input-output characteristics of the additional A/D converter are selected in a non-linear form, that is, in a logarithmic form, then the volume of sound can be controlled substantially in a linear manner with respect to the digital control input.

The resistor $R_2$ connected between the nodes 2 and 3 in FIG. 5 is a protective resistor for protecting the D/A converter from being destroyed when the variable resistor $R_1$ takes a low resistance value, and hence under such condition that an excessive current could not flow through the variable resistor $R_1$, the protective resistor $R_2$ could be omitted.

It is to be noted that in the modified embodiment shown in FIG. 7, instead of powering off the subject output circuit by turning the potential at the $i_4$ input terminal to a high level, the power consumption of the output circuit can be eliminated by digitally controlling the additional current output type D/A converter so as to issue a zero output current.

I claim:

1. An output circuit comprising:

a speaker having first (115) and second (116) input terminals;

a voltage terminal (GND);

a first node (103);

a second node (112);

variable means (R1 or D/A) for providing a variable bias current to said first node;

a first field effect transistor (N3) having a gate and a source-drain conduction path and controlling the conductivity of said source-drain conduction path in accordance with the voltage at said gate, said source-drain conduction path of said first field effect transistor being coupled between said first node and said voltage terminal;

connection means (N1) for electrically connecting said gate of said first field effect transistor to said first node;

a plurality of current source transistors (N6, N10, N13) each having a gate and a source-drain conduction path and each controlling the conductivity of its source-drain conduction path in accordance with the voltage at its gate, said source-drain conduction paths of said plurality of current source transistors being coupled in parallel with one another between said second node and said voltage terminal;

a plurality of transfer field effect transistors (N4, N8, N11) each having a gate and a source-drain conduction path and each varying the conductivity of its source-drain conduction path in accordance with the voltage at its gate, the source-drain conduction paths of each of said plurality of transfer field effect transistors each being coupled between said first node and the gate of a respective one of said current source transistors and each receiving at its gate a respective one of a plurality of digital signals ($i_0$, $i_1$, $i_2$);

a first terminal (113) receiving a first frequency signal ($i_3$);

a second terminal (114) receiving a second frequency signal having an opposite phase to said first frequency signal;

a further voltage terminal (117); and first (P1), second (P2), third (P3) and fourth (P4) switch field effect transistors each having a gate and a source-drain conduction path and each varying the conductivity of its source-drain conduction path in accordance with the voltage at its gate, said first switch field effect transistor (P1) having its source-drain conduction path coupled between said first input terminal of said speaker and said further voltage terminal and having its gate coupled to said second terminal, said second switch field effect transistor (P2) having its source-drain conduction path coupled between said first input terminal of said speaker and said second node and having its gate coupled to said first terminal, said third switch field effect transistor (P3) having its source-drain conduction path coupled between said second input terminal of said speaker and said further voltage terminal and having its gate coupled to said further terminal, and said fourth switch field effect transistor (P4) having its source-drain conduction path coupled between said second input terminal of said speaker and said second node and having its gate coupled to said second terminal.

2. The circuit according to claim 1 further comprising a plurality of further field effect transistors (N5, N9, N12) each having a gate and a source-drain conduction path and each varying the conductivity of its source-drain conduction path in accordance with the voltage at its gate, the source-drain conduction paths of said plurality of further field effect transistors (N5, N9, N12) each being coupled between said voltage terminal and the gate of an associated one of said current source field effect transistors and each receiving at its gate a signal having a phase opposite to that of the digital signal applied to the gate of the transfer field effect transistor connected to said associated current source field effect transistor.

3. The circuit according to claim 1 further comprising a bias voltage terminal (101), in which said variable means includes a series circuit of a variable resistor ($R_1$) and a fixed value resistor ($R_2$) connected in series between said bias voltage terminal and said first node.

4. The circuit according to claim 1 in which said variable means includes a digital-to-analog converter for receiving a predetermined digital input value and providing a corresponding analog current output as said bias current to said first node.

5. The circuit according to claim 1, in which the conductivities of said source-drain conduction paths in said current source field effect transistors bear predetermined ratios to one another.

6. An output circuit comprising:

a digital-to-analog converter including first (101) and second (GND) voltage terminals, variable resistor means (R1 or D/A), a reference current field effect transistor (N3) having a gate and a source-drain conduction path and varying the conductivity of its source-drain conduction path in accordance with the potential at its gate, said source-drain conduction path of said reference current field effect transistor being connected in series with said variable resistor means to form a series circuit connected between said first and second voltage terminals, means (N1) for connecting said gate of said reference current field effect transistor to an intermediate junction of said series circuit, a variable bias potential being generated from said intermediate junction, a current output terminal (112), a plurality of current source field effect transistors (N6, N10, N13) each having a gate and a source-drain conduction path and each varying the conductivity of its source-drain conduction path in accordance with the potential at its gate, the source-drain conduction paths of said current source field effect transistors being coupled in parallel with one another between said current output terminal and said second voltage terminal, means (106, 108, 110) for receiving a plurality of digital input signals for selectively supplying said gates of said current source field effect transistors with said variable bias potential;

a third voltage terminal (117);

a speaker having first (115) and second (116) input terminals;

a first control terminal (113) receiving a first signal;

a second control terminal (114) receiving a second signal of a phase opposite to that of said first signal; and first (P1), second (P2), third (P3) and fourth (P4) switch field effect transistors each having a gate and a source-drain conduction path and each varying the conductivity of its source-drain conduction path in accordance with the potential at its gate, said first switch field effect transistor having its source-drain conduction path coupled between said first input terminal of said speaker and said third voltage terminal and having its gate coupled to said second control terminal, said second switch field effect transistor having its source-drain conduction path coupled between said first input terminal of said speaker and said current output terminal and having its gate coupled to said first control terminal, said third switch field effect transistor having its source-drain conduction path coupled between said second input terminal of said speaker and said third voltage terminal and having its gate coupled to said first control terminal, and said fourth switch field effect transistor having its source-drain conduction path coupled between said second input terminal of said speaker and said current output terminal and having its gate coupled to said second control terminal.

7. The circuit according to claim 6, in which said supply means includes a plurality of transfer field effect transistors (N4, N8, N11) each having a gate and a source-drain conduction path and each varying the conductivity of its source-drain conduction path in accordance with the potential at its gate, the source-drain conduction paths of said plurality of transfer field effect transistors each being coupled between said intermediate junction and the gate of an associated one of said current source field effect transistors.

8. A circuit comprising:

first (101) and second (GND) voltage terminals;

a current output terminal (112);

a reference current field effect transistor (N3) having a gate and a source-drain conduction path and varying the conductivity of its source-drain conduction path in accordance with the potential at its gate;

variable resistor means (R1 or D/A) connected in series with said source-drain conduction path of said reference current field effect transistor to form a series circuit;

first means (N1) for connecting said gate of said reference current field effect transistor to an intermediate connection point of said series circuit between said variable resistor means and said source-drain conduction path of said reference current field effect transistor, a variable bias potential being generated from said intermediate connection point;

a plurality of current source field effect transistors (N6, N10, N13) each having a gate and a source-drain conduction path and each varying the conductivity of its source-drain conduction path in accordance with the potential at its gate, the source-drain conduction paths of said current source field effect transistors being coupled in parallel with one another between said current output terminal and said second voltage terminal; and a plurality of connection circuits (e.g. N4 and N5, N8 and N9, N11 and N12) each receiving a respective one of a plurality of digital signals ($i_0$, $i_1$, $i_2$) and each selectively connecting the gate of an associated one of said current source transistors to said intermediate connection point in response to its received digital signal, each of said connection circuits including a first field effect transistor (e.g. N4) having a gate and a source-drain conduction path and varying the conductivity of its source-drain conduction path in accordance with the potential at its gate, said first field effect transistor having its source-drain conduction path coupled between said intermediate connection point and the gate of said associated current source transistor (e.g. N6) and receiving said respective digital signal (e.g. $i_0$) at its gate, and a second transistor (e.g. N5) having a gate and a source-drain conduction path and varying the conductivity of its source-drain conduction path in accordance with the potential at its gate, said second transistor having its source-drain conduction path coupled between said second voltage terminal (GND) and the gate of said first field effect transistor (N6) of the same connection circuit (N4 and N5) and receiving at its gate a digital signal having a phase opposite to that of the digital signal applied to the gate of said first field effect transistor.

9. An output circuit comprising:

a digital-to-analog converter including first (101) and second (GND) voltage terminals, a reference current field effect transistor (N3) having a gate and a source-drain conduction path and varying the conductivity of its source-drain conduction path in accordance with the potential at its gate, resistor means (R1 or D/A) connected in series with said source-drain conduction path of said reference current field effect transistor between said first and second voltage terminals, means (N1) for connecting said gate of said reference current field effect transistor to a connection point between said resistor means and said source-drain conduction path of said reference current field effect transistor, a bias potential being generated from said connection point, a current output terminal (112), a plurality of current source field effect transistors (N6, N10, N13) each having a gate and a source-drain conduction path and each varying the conductivity of its source-drain conduction path in accordance with the potential at its gate, the source-drain conduction paths of said current source field effect transistors being coupled in parallel with one another between said current output terminal and said second voltage terminal, means (106, 108, 110) for receiving a plurality of digital input signals ($i_0$, $i_1$, $i_2$), and supply means (N4 and N5, N8 and N9, N11 and N12) responsive to said digital input signals for selectively supplying said gates of said current source field effect transistors with said bias voltage, said supply means including a plurality of transfer field transistors (N4, N8, N11) each (e.g. N4) having a gate and a source-drain conduction path and each varying the conductivity of its source-drain conduction path in accordance with the potential at its gate, the source-drain conduction paths of said plurality of transfer field effect transistors each (e.g. N4) being coupled between said connection point and the gate of an associated one (e.g. N6) of said current source field effect transistors and each receiving at its gate a respective one (e.g. $i_0$) of said digital input signals, and a plurality of clamp field effect transistors (N5, N9, N12) each (e.g. N5) having a gate and a source-drain conduction path and each varying the conductivity of its source-drain conduction path in accordance with the potential at its gate, the source-drain conduction paths of said clamp field effect transistors each (e.g. N5) being coupled between said second voltage terminal and the gate of said associated current source transistor (e.g. N6) and each receiving at its gate a digital signal having a phase opposite to that of the respective digital signal (e.g. $i_0$) applied to the gate of the associated transfer field effect transistor (e.g. N4);

a third voltage terminal (117);

a speaker having first (115) and second (116) input terminals;

a first control terminal (113) receiving a first signal ($i_3$);

a second control terminal (114) receiving a second signal of opposite phase to said first signal; and first (P1), second (P2), third (P3) and fourth (P4) switch field effect transistors each having a gate and a source-drain conduction path and each varying the conductivity of its source-drain conduction path in accordance with the potential at its gate, said first switch field effect transistor having its source-drain conduction path coupled between said first input terminal of said speaker and said third voltage terminal and having its gate coupled to said second control terminal, said second switch field effect transistor having its source-drain conduction path coupled between said first input terminal of said speaker and said current output terminal and having its gate coupled to said first control terminal, said third switch field effect transistor having its source-drain conduction path coupled between said second input terminal of said speaker and said third voltage terminal and having its gate coupled to said first control terminal, and said fourth switch field effect transistor having its source-drain conduction path coupled between said second input terminal of said speaker and said current output terminal and having its gate coupled to said second control terminal.

* * * * *

UNITED STATES PATENT AND TRADEMARK OFFICE

CERTIFICATE OF CORRECTION

PATENT NO. : 4,408,094

DATED : October 4, 1983

INVENTOR(S) : Toshio Oura

It is certified that error appears in the above-identified patent and that said Letters Patent is hereby corrected as shown below:

Column 1, line 58, before "object" change "anoghes" to --another--.

Column 3, line 68, before "Q3" change "tor" to --tors--.

Column 4, line 27, after "merely" change "switc" to --switch--.

Column 4, line 60, after "19" change "wire" to --will--.

Signed and Sealed this

*Eleventh* Day of *September 1984*

[SEAL]

*Attest:*

GERALD J. MOSSINGHOFF

*Attesting Officer* *Commissioner of Patents and Trademarks*